(12) United States Patent
Wilkinson et al.

(10) Patent No.: US 10,147,688 B2
(45) Date of Patent: Dec. 4, 2018

(54) INTEGRATED CIRCUIT DEVICE WITH OVERVOLTAGE DISCHARGE PROTECTION

(71) Applicant: Allegro Microsystems, LLC, Manchester, NH (US)

(72) Inventors: William Wilkinson, Manchester, NH (US); Washington Lamar, Mont Vernon, NH (US); Maxim Klebanov, Waltham, MA (US)

(73) Assignee: Allegro Microsystems, LLC, Manchester, NH (US)

( * ) Notice: Subject to any disclaimer, the term of this patent is extended or adjusted under 35 U.S.C. 154(b) by 263 days.

(21) Appl. No.: 15/053,397

(22) Filed: Feb. 25, 2016

(65) Prior Publication Data

US 2017/0250143 A1    Aug. 31, 2017

(51) Int. Cl.

| | |
|---|---|
| *H02H 9/00* | (2006.01) |
| *H01L 23/60* | (2006.01) |
| *H01L 23/31* | (2006.01) |
| *H01L 43/02* | (2006.01) |
| *H01L 23/495* | (2006.01) |

(Continued)

(52) U.S. Cl.
CPC .......... *H01L 23/60* (2013.01); *H01L 23/3142* (2013.01); *H01L 43/02* (2013.01); *H01L 23/495* (2013.01); *H01L 24/32* (2013.01); *H01L 24/48* (2013.01); *H01L 24/73* (2013.01); *H01L 25/0655* (2013.01); *H01L 2224/04042* (2013.01); *H01L 2224/32225* (2013.01); *H01L 2224/32245* (2013.01); *H01L 2224/48091* (2013.01); *H01L 2224/48247* (2013.01); *H01L 2224/73265* (2013.01); *H01L 2924/19107* (2013.01)

(58) Field of Classification Search
CPC ....................................................... H01L 23/60
See application file for complete search history.

(56) References Cited

U.S. PATENT DOCUMENTS

| | | |
|---|---|---|
| 5,301,084 A | 4/1994 | Miller |
| 8,018,002 B2 | 9/2011 | Salman et al. |

(Continued)

OTHER PUBLICATIONS

U.S. Non-Final Office Action dated Apr. 6, 2018 for U.S. Appl. No. 15/245,689; 16 Pages.

(Continued)

*Primary Examiner* — Stephen W Jackson
(74) *Attorney, Agent, or Firm* — Daly Crowley Mofford & Durkee LLP

(57) ABSTRACT

An integrated circuit device includes a package and at least two leads exposed external to the package to permit electrical connections to the package. A first die situated in the package has a first substrate and at least a first terminal electrically coupled to a first one of the leads. A second die situated in the package has a second substrate and at least a second terminal electrically coupled to a second one of the lead. An adhesive material holding the first and second die in place forms a voltage-triggered conduction path between the first and second die electrically that isolates the second die from the first die under a first condition and provides an ESD current path between the first one of the leads and the second one of the leads under a second condition.

32 Claims, 7 Drawing Sheets

(51) Int. Cl.
*H01L 23/00* (2006.01)
*H01L 25/065* (2006.01)

(56) References Cited

U.S. PATENT DOCUMENTS

| | | | |
|---|---|---|---|
| 8,040,645 B2* | 10/2011 | Jalilizeinali | H01L 23/60 361/56 |
| 9,941,224 B2* | 4/2018 | Lamar | H01L 23/60 |
| 2007/0075409 A1 | 4/2007 | Letterman, Jr. et al. | |
| 2008/0265389 A1 | 10/2008 | Hsu et al. | |
| 2011/0026173 A1 | 2/2011 | Karp | |
| 2011/0175699 A1 | 7/2011 | Huss et al. | |
| 2014/0098448 A1 | 4/2014 | Henderson et al. | |
| 2014/0210108 A1 | 7/2014 | Park | |
| 2016/0190918 A1 | 6/2016 | Ho et al. | |
| 2017/0250143 A1 | 8/2017 | Wilkinson et al. | |
| 2018/0061820 A1 | 3/2018 | Klebanov et al. | |

OTHER PUBLICATIONS

U.S. Appl. No. 15/245,689, filed Aug. 24, 2016, Klebanov, et al.
U.S. Appl. No. 15/245,699, filed Aug. 24, 2016, Lamar, et al.
U.S. Non-Final Office Action dated Sep. 28, 2017 for U.S. Appl. No. 15/245,699; 17 pages.
U.S. Non-Final Office Action dated Oct. 10, 2017 for U.S. Appl. No. 15/245,689; 20 pages.
Notice of Allowance dated Dec. 15, 2017 for U.S. Appl. No. 15/245,699; 6 Pages.
U.S. Non-Final Office Action dated Feb. 27, 2017 for U.S. Appl. No. 15/245,689; 19 Pages.
U.S. Non-Final Office Action dated Jun. 28, 2018 for U.S. Appl. No. 15/907,445; 7 pages.
Response to U.S. Non-Final Office Action dated Oct. 10, 2017 for U.S. Appl. No. 15/245,689; Response filed Dec. 21, 2017; 6 Pages.
Response to Office Action filed Aug. 2, 2017 for U.S. Appl. No. 15/245,689; 20 pages.
Response to U.S. Non-Final Office Action dated Sep. 28, 2017 for U.S. Appl. No. 15/245,699; Response Filed Nov. 30, 2017; 9 Pages.
Response to Office Action filed May 25, 2017 for U.S. Appl. No. 15/245,689; 12 pages.
Response to U.S. Non-Final Office Action dated Jun. 28, 2018 for U.S. Appl. No. 15/907,445; Response filed Jul. 11, 2018; 7 pages.
Response to U.S. Non-Final Office Action dated Apr. 6, 2018 for U.S. Appl. No. 15/245,689; Response filed May 16, 2018; 12 Pages.

* cited by examiner

INTEGRATED CIRCUIT DEVICE WITH OVERVOLTAGE DISCHARGE PROTECTION

FIELD

This disclosure relates to integrated circuit devices and, more particularly, to integrated circuit devices with multiple substrates having a voltage-triggered conduction path for protection from overvoltage conditions.

BACKGROUND integrated circuit devices are found in every area of modern technology. An integrated circuit device, often referred to as an IC or chip, includes a set of electronic circuits on a small plate or die of semiconductor material, which may be silicon-based. The circuits can be very small and fragile, so they are usually enclosed within a protective package having external leads or pins that can connect to external circuitry. Inside the package, electrical leads (e.g. lead wires) connect the external pins to contacts on the electronic circuits.

Handling and operation of integrated circuit devices, during manufacturing or installation for example, creates a risk that the electronic circuits may be damaged. If a static charge has built up on a person handling the device, and that person touches one of the external pins, the static electricity may flow through the integrated circuit device causing damage to the electronic circuits. The problem is so pervasive that there exist many industry standards and tests to ensure that integrated circuit devices can withstand electrostatic discharge according to the so-called Human-body model, a characterization of the discharge that can occur when a human touches an electronic device.

SUMMARY

In an embodiment, an apparatus includes a package and at least two leads exposed external to the package to permit electrical connections to the package. A first die situated in the package has a first substrate and at least a first terminal electrically coupled to a first one of the leads. A second die situated in the package has a second substrate and at least a second terminal electrically coupled to a second one of the lead. A voltage-triggered conduction path between the first and second die electrically isolates the second die from the first die under a first condition and provides an ESD current path between the first one of the leads and the second one of the leads under a second condition.

One or more of the following features may be included,

The first and/or second die may support a magnetic field sensor circuit and the apparatus may be a magnetic field sensor. The first and/or second substrates may comprise a ground plane.

The voltage-triggered conduction path may include a material having a conductivity threshold voltage, which may be in physical contact with the first substrate and the second substrate. A conductivity of the material is substantially zero when a voltage across the material is less than the conductivity threshold voltage. The conductivity threshold voltage may be about 45 volts. The conductivity of the material may increase as a voltage across the material increases.

The material may be a substantially flat layer in contact with at least a portion of the first and second substrates. The substantially flat layer may be in contact with an entire surface of the first substrate and an entire surface of the second substrate. The material may be an adhesive that forms a layer that holds the first and/or second die in place within the package, The package may contain a lead frame comprising a die-attach portion and the adhesive holds the first and/or second die in contact with the die-attach portion.

The material may form a bi-directional ESD current path. The first and second conditions may be predetermined voltages across the path.

In another embodiment, an apparatus comprises a package and at least two leads extending from the package and providing electrical connections to the package. A first die may be situated in the package having a first substrate and at least a first terminal electrically coupled to a first one of the leads. A second die may be situated in the package having a second substrate and at least a second terminal electrically coupled to a second one of the leads, wherein the second die is electrically isolated from the first die. An adhesive material forms a layer that supports the first and second die and holds the first and second die in place within the package, wherein the adhesive material forms an ESD current path between the first one of the leads and the second one of the leads.

One or more of the following features may be included.

The adhesive material may form a bi-directional ESD current path between the first one of the leads and the second one of the leads. The adhesive material may be in contact with at least a portion of a surface of the first die and at least a portion of a surface of the second die. The conductivity of the adhesive may increase as a voltage across the material increases.

In another embodiment, an apparatus includes a package and a lead frame having a plurality of leads, at least two of which are exposed external to the package to permit electrical connections to the package. The apparatus includes at least two die-attach paddles, each associated with a respective lead and a die situated in the package comprising. The die includes a substrate, a first terminal electrically coupled to a first one of the leads, and a second terminal coupled to a second one of the leads. A voltage-triggered conduction path between the first and second die-attach paddles electrically isolates the first die-attach paddle from the second die-attach paddle under a first condition and provides an ESD current path between the first die-attach paddle from the second die-attach paddle under a second condition.

One or more of the following features may be included.

The die may support a magnetic field sensor circuit. The apparatus may be a magnetic field sensor. The voltage-triggered conduction path may include a material having a conductivity threshold voltage. The material may be in physical contact with the substrate and at least one of the die-attach paddles.

The conductivity of the material may be substantially zero when a voltage across the material is less than the conductivity threshold voltage. The conductivity threshold voltage may be about 45 volts. A conductivity of the material may increase as a voltage across the material increases.

The material may form a substantially flat layer in contact with at least a portion of the substrate. The material may be an adhesive. The adhesive may form a layer that adheres the die to the first and/or second die-attach paddles and holds the die in place within the package. The material may form a bi-directional ESD current path. The first and second conditions may be predetermined voltages across the ESD current path.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance ((SMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
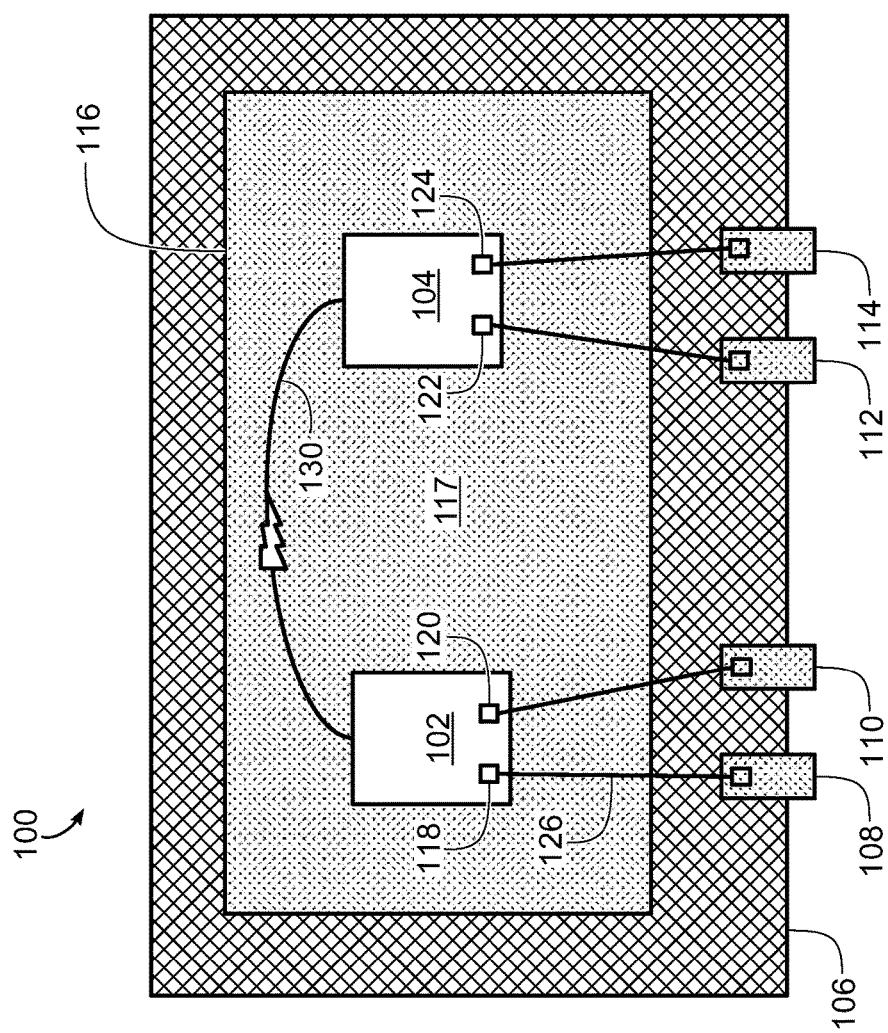
FIG. 1 is a block diagram of an integrated circuit having multiple substrates of the prior art.

As used herein, the terms "target" and "magnetic target" are used to describe an object to be sensed or detected by a magnetic field sensor or magnetic field sensing element, FIG. 1 is a block diagram of an integrated circuit device 100 of the prior art. Integrated circuit device 100 includes two die having semiconductor substrates 102 and 104 enclosed in IC package 106, The package includes one or more external leads 108-114 that can be connected to external circuitry on a circuit hoard, for example.

Semiconductor substrates 102 and 104 may be situated on a die-attach portion or paddle 117 of lead frame 116 which may support substrates 102 and 104. Lead frame 116 further includes leads, one or more of which may be electrically coupled or physically connected to die-attach portion 117 and one or more of which form external leads 108-114.

Substrates 102 and 104 may be attached to lead frame 116, which may facilitate connections between external leads 108-114 and substrates 102 and 104. As shown in FIG, 1, lead wires such as lead wire 126 may be coupled between external leads 108-114 and terminals 118-124. Terminals 118-124 may be pads or areas on substrates 102 and 104 where the lead wires can be wire bonded to form electrical connections with the circuits on substrates 102 and 104 to provide electrical connections between terminals 118-124 and external leads 108-114.

Integrated circuit devices like the one shown in FIG, 1 may be at risk for incurring damage in the case of an electrostatic discharge (ESD) event. For example, assume that external lead 114 is grounded and a person who has built up a static charge touches external pin 108. The charge may flow from the person, through external pin 108 and into substrate 102. If the ESD voltage is high enough, the charge may arc from substrate 102 to 104, as illustrated by electrical arc 130, so that it can reach the ground connection on pin 114.

ESD events often involve high voltages and currents. An uncontrolled arc 130 between substrates 102 and 104 caused by an ESD event may cause damage to the electronic circuits on substrate 102 or 104, or may cause them to malfunction or could lead to residual or trapped charge on 102 or 104, which may affect functionality.

Figure 2:
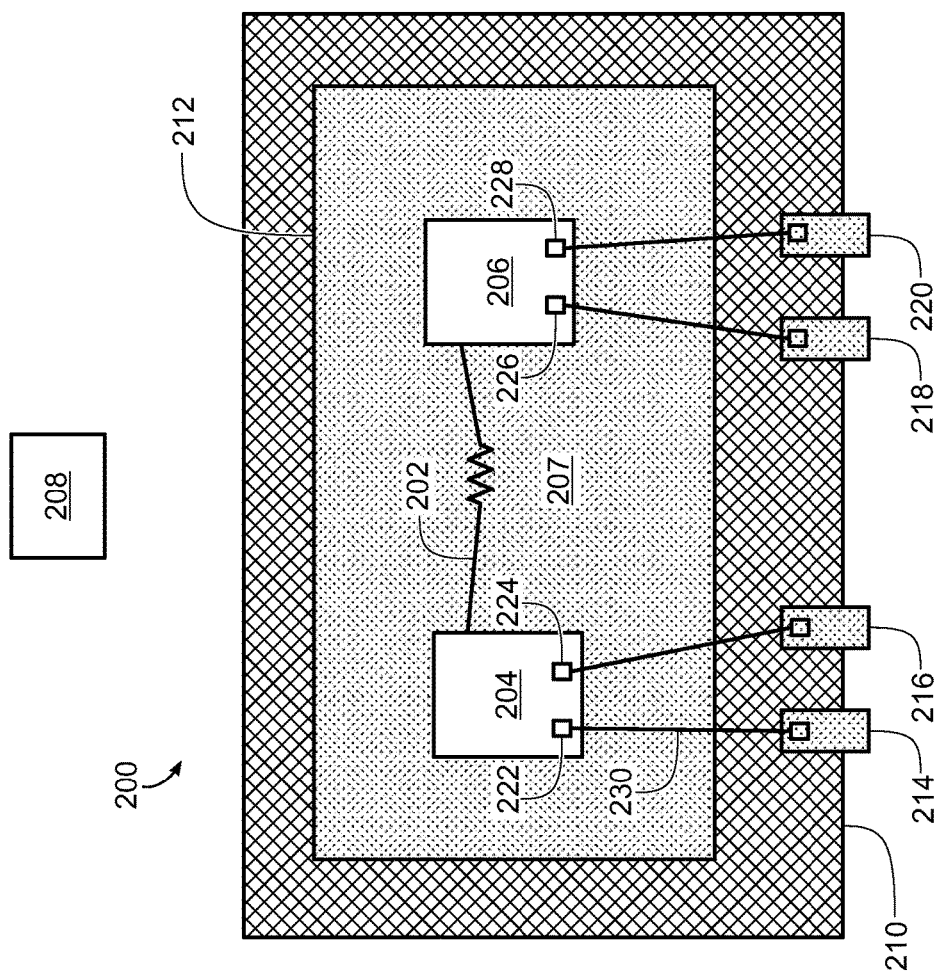
FIG. 2 is a block diagram of an integrated circuit having multiple substrates and an electrostatic discharge (ESD) protection path.

Turning to FIG. 2, an integrated circuit device 200 includes two semiconductor die including semiconductor substrates 204 and 206, The substrates 204 and 206 may include electronic circuits to perform various functions. Integrated circuit device 200 includes a package 210 and a lead frame 212. Substrates 204 and 206 may be attached to a die-attach portion 207 or paddle of lead frame 212, which may facilitate electrical connections between substrates 204 and 206 and external leads 214-220, Die-attach portion 207 may support multiple die or lead frame 212 may include multiple die-attach portions, each supporting one or more die. In an embodiment, a ground plane of substrates 204 and 206 may be in contact with lead frame 212, In other embodiments, the ground plane of one or both of substrates 204 and 206 may be electrically isolated from lead frame 212.

Lead wires, such as lead wire 230, may provide electrical connections from substrates 204 and 206 to external leads 214-220. Substrates 204 and 206 may include terminals 222-228, which may be pads or similar elements, to which the lead wires can be wire bonded or with which the lead wires can otherwise make an electrical connection, Thus, the lead wires may act as conductors that provide electrical connections from substrates 204 and 206 to the external leads 214-220. Other structures and techniques may also be used to electrically couple substrates 204 and 206 to external leads 214-220, such as solder balls or solder bumps in the case of a flip-chip configuration, etc.

In other embodiments, other types of lead frames may be used. For example, integrated circuit device 200 may include a lead frame with multiple die-attach portions, each die-attach portion supporting its own substrate. If integrated circuit device 200 includes more than two substrates, lead frame 212 may have one die-attach portion that supports all the substrates, one die-attach portion for each substrate, multiple die-attach portions that each support more than one substrate, or a combination of these. In yet another embodiment, multiple die-attach portions may be used to support a single substrate or multiple substrates. An example of multiple lead frame paddles supporting a single substrate will be discussed later in connection with FIG. 7.

In an embodiment, the electronic circuits of substrates 204 and 206 are magnetic field detection circuits configured to detect the presence, position, speed, rotation, or other aspects or properties of ferromagnetic target 208. Such circuits may be used in a variety of application including, but not limited to, automotive braking systems, automotive transmissions, game joystick controls, motor or generator systems, or any other application where it is useful to detect motion or position of a target. For example, if integrated circuit device 200 is a magnetic field sensor, and target 208 is attached to an end of an automotive camshaft that is operating the valves of an internal combustion engine, the magnetic field sensor may collect information about the presence, rotational speed, and/or position of target 208 as the camshaft rotates and provide the information to an automotive computer (or other circuit) for control and operation of the engine.

Certain applications, such as those where safety is critical, require fault tolerant circuits and systems to ensure operation. For example, automobile manufacturers often require that integrated circuit devices that are part of a transmission or braking system incorporate fault tolerant designs and features so that, if an error or fault occurs, the system may continue to operate. In many cases, fault tolerance can be achieved by providing redundant circuits in a system, i.e. circuits that perform the same function, so that if one of the circuits fails, the other may continue to work. In an embodiment, integrated circuit device 200 may incorporate fault tolerant design elements. For example, in an embodiment, the electronic circuits on substrates 204 and 206 may be redundant circuits performing the same function, If one of the circuits fails, the other may continue to operate. In other embodiments, perhaps where redundant-circuit fault tolerance is not required, the electronic circuits on substrates 204 and 206 are different circuits that perform different functions.

Whether the electronic circuits on substrates 204 and 206 are performing the same or different functions, providing an ESD conduction path 202 between the substrates can protect the electronic circuits from ESD events like the one described above. ESD conduction path 202 may provide a controlled path through which current can flow in the case of an ESD event, so that an electrical arc does not occur between substrates 204 and 206.

In an embodiment, ESD conduction path 202 is a conductor (for example a lead wire) having a high enough resistance so that, under normal operation, substrates 204 and 206 remain relatively electrically isolated from each other such that minimal current flows between them. However, this situation may not be ideal if greater electrical isolation is desired. In another embodiment, ESD conduction path 202 may be a voltage-triggered ESD conduction path. For example, ESD conduction path 202 may include an ESD clamp circuit similar in design or operation to ESD clamp circuit 702 shown in FIG. 7. The Zener diodes included in ESD clamp circuit 702 may have a reverse breakdown voltage where, under normal operating conditions, substrates 204 and 206 will remain electrically isolated from each other in the presence of normal operating voltage across the ESD clamp circuit. However, if the voltage increases above the Zener diodes' reverse breakdown threshold, the Zener diode will effectively 'close' like a switch and current will flow through the ESD clamp circuit. In other words, once the voltage across the ESD clamp circuit exceeds the breakdown threshold, the voltage will trigger the ESD clamp circuit to conduct. This can occur in the case of an ESD event where the high ESD voltage may surpass the reverse breakdown voltages of the Zener diodes, allowing current caused by the ESD event to flow through the ESD clamp circuit.

In another embodiment, ESD conduction path 202 may include other types of voltage-controlled or voltage-triggered conduction paths. In one example, ESD conduction path 202 may include transistors or voltage-controlled switches that can be triggered to turn on or close in the presence of an ESD event.

Figure 3:
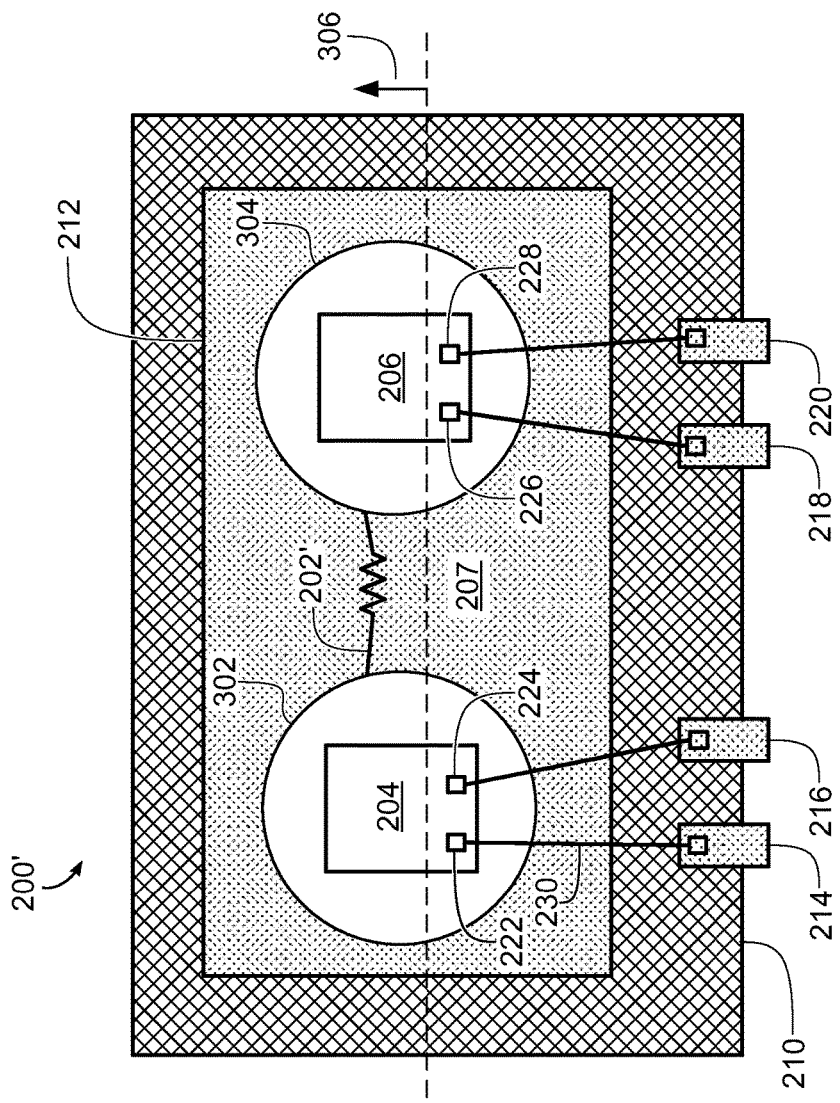
FIG. 3 is a block diagram of an integrated circuit having multiple substrates and a material forming an electrostatic discharge (ESD) protection path.

Turning to FIG. 3, integrated circuit device 200' may be the same as or similar to integrated circuit device 200 of FIG. 2, and may also include a voltage-triggered ESD conduction path 202' which may be the same as or similar to ESD conduction path 202, Integrated circuit device 200' may also include material 302 and material 304 that form a portion of ESD conduction path 202'. The material 302 and material 304 may be the same material substance or may be different material substances. Material 302 and 304 may form substantially flat layers between the substrates and lead frame 212.

In an embodiment, material 302 and 304 may act as electrical insulators under normal operating voltages. However, material 302, material 304, or both may have a material property that provides a breakdown or conductivity threshold voltage such that, when a voltage across the material surpasses the conductivity threshold voltage, the material becomes conductive.

In embodiments, material 302 is interposed between and in contact with substrate 204 and lead frame 212, and material 304 is interposed between and in contact with substrate 206 and lead frame 212, forming the voltage-triggered ESD conduction path 202'between substrates 204 and 206. More particularly, material 302 and 304 may be in contact with die-attach portion 207 of the lead frame. Under normal operating conditions, the voltage between substrate 204 and lead frame 212 typically does not surpass material 302's breakdown voltage, and the voltage between substrate 206 and lead frame 212 typically does not surpass material 304's breakdown voltage. Under these circumstances, material 302 and material 304 may act as insulators or open circuits so that substrates 204 and 206 remain electrically isolated from each other. However, in the case of an ESD event between external leads 214 and 220, for example, the voltage across external leads 214 and 220 (and across material 302 and material 304) may cause material 302 and material 304 to become conductive. In this case, current caused by the ESD event may flow from external lead 214, into substrate 204, through material 302, through lead frame 212, through material 304, into substrate 206, and finally out to external lead 220, Material 302 and 304 are shown as separate elements in FIG. 3. However, in other embodiments, material 302 and 304 may be joined to form a continuous material element. In this case, both substrates 204 and 206 may be in contact with the continuous material element, which in turn may be in contact with lead frame 212.

In an embodiment, material 302 and 304 may be an adhesive used to adhere substrate 204 and 206 in place on a die-attach portion of lead frame 212. The adhesive comprising material 302 and 304 may be interposed between and in contact with substrate 204 and lead frame 212 and/or interposed between and in contact with substrate 204 and lead frame 212, respectively. In an embodiment, the same adhesive may be used for both material 302 and 304, or different adhesives may be used. If the material is not an adhesive, then separate adhesive layer may be used to adhere substrates 204 and 206 in place.

As described above, the adhesive may have a breakdown or conductivity threshold voltage so that, when a voltage across the adhesive is below the conductivity threshold voltage, the adhesive conducts zero or minimal current, and when the voltage across the adhesive is above the conductivity threshold voltage, the adhesive acts as a conductor allowing current to flow. Examples of adhesives exhibiting this property are Loctite® Ablestik® QMI519 and Hysol® QMI519.

Figure 4:
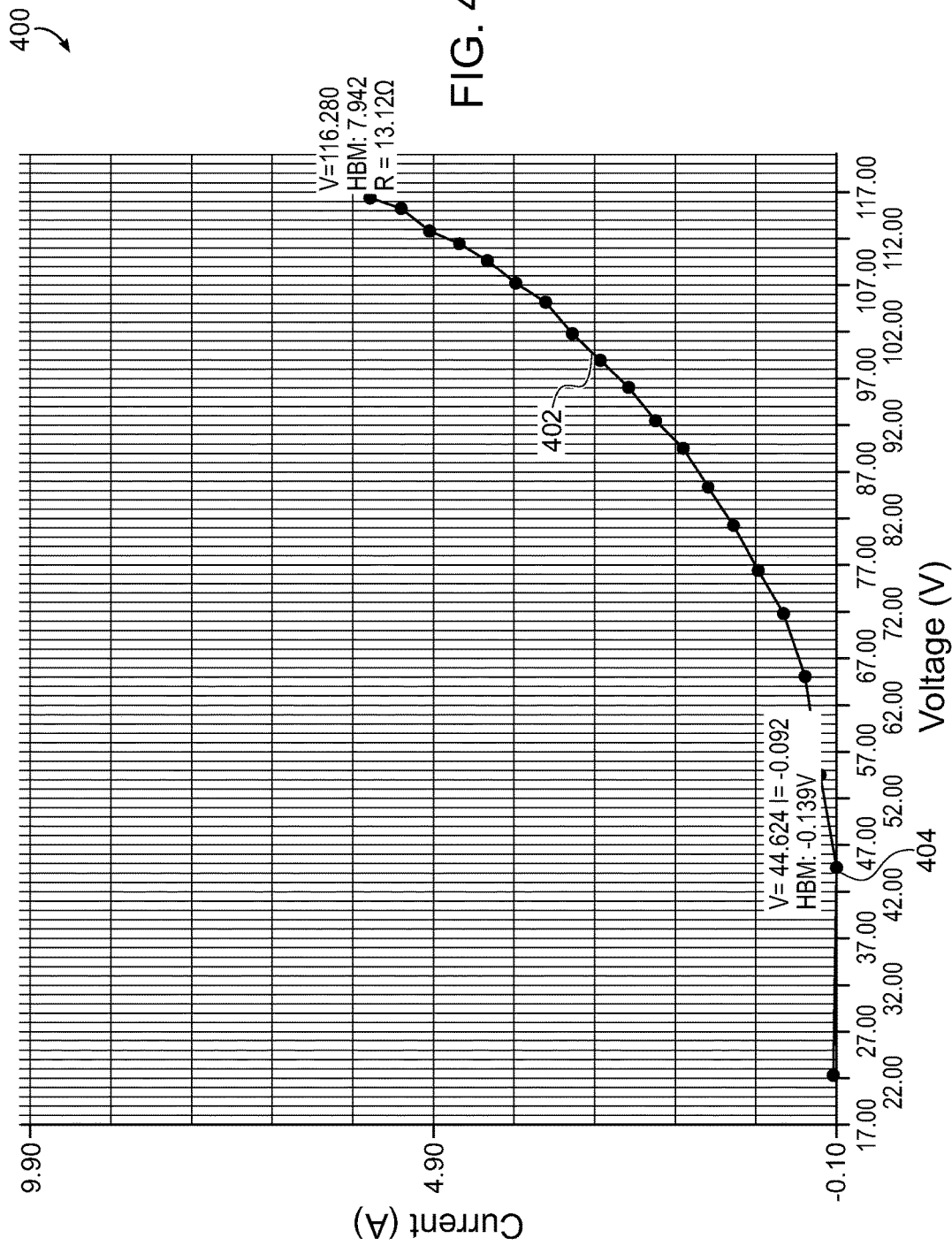
FIG. 4 is a graph showing a current-voltage (IV) curve of a material for forming an ESD protection path.

Referring to FIG. 4, a graph 400 includes a current-voltage (IV) curve 402 illustrating the conductive properties of a material having a conductivity threshold voltage (e.g. material 302 or 304). The horizontal axis represents voltage across the material (in units of Volts) and the vertical axis represents current through the material (in units of Amperes). The measurements in FIG. 4 were taken using a sample of Loctite Ablestik QMI519 or Hysol QMI519. However, other materials or adhesives may also demonstrate a conductivity threshold voltage and may be suitable for forming ESD conduction path 202'.

As shown by curve 402, the measured material has a conductivity threshold voltage at about point 404, corresponding to about 45 V. When the voltage across the material is between 0 V and the conductivity threshold voltage at about 45 V, the current through the material is substantially zero or negligible. When the voltage across the material is greater than 45 V, current begins to flow through the material as shown by the rising shape of curve 402 at voltages higher than 45 V. Thus, if this material is used to form ESD conduction path 202', the material may electrically isolate substrates 202 and 204 from each other at by not allowing current to flow so long as the voltage across the material is less than about 45 V. In the case of an ESD event, the voltage across the material will likely increase to levels higher than the conductivity threshold voltage of 45 V. In this case, the material will allow current to flow between substrates 202 and 204 as described above, preventing a potentially damaging electrical arc between the substrates and directing the charge from the ESD event to an external lead where it can be dissipated.

Figure 5:
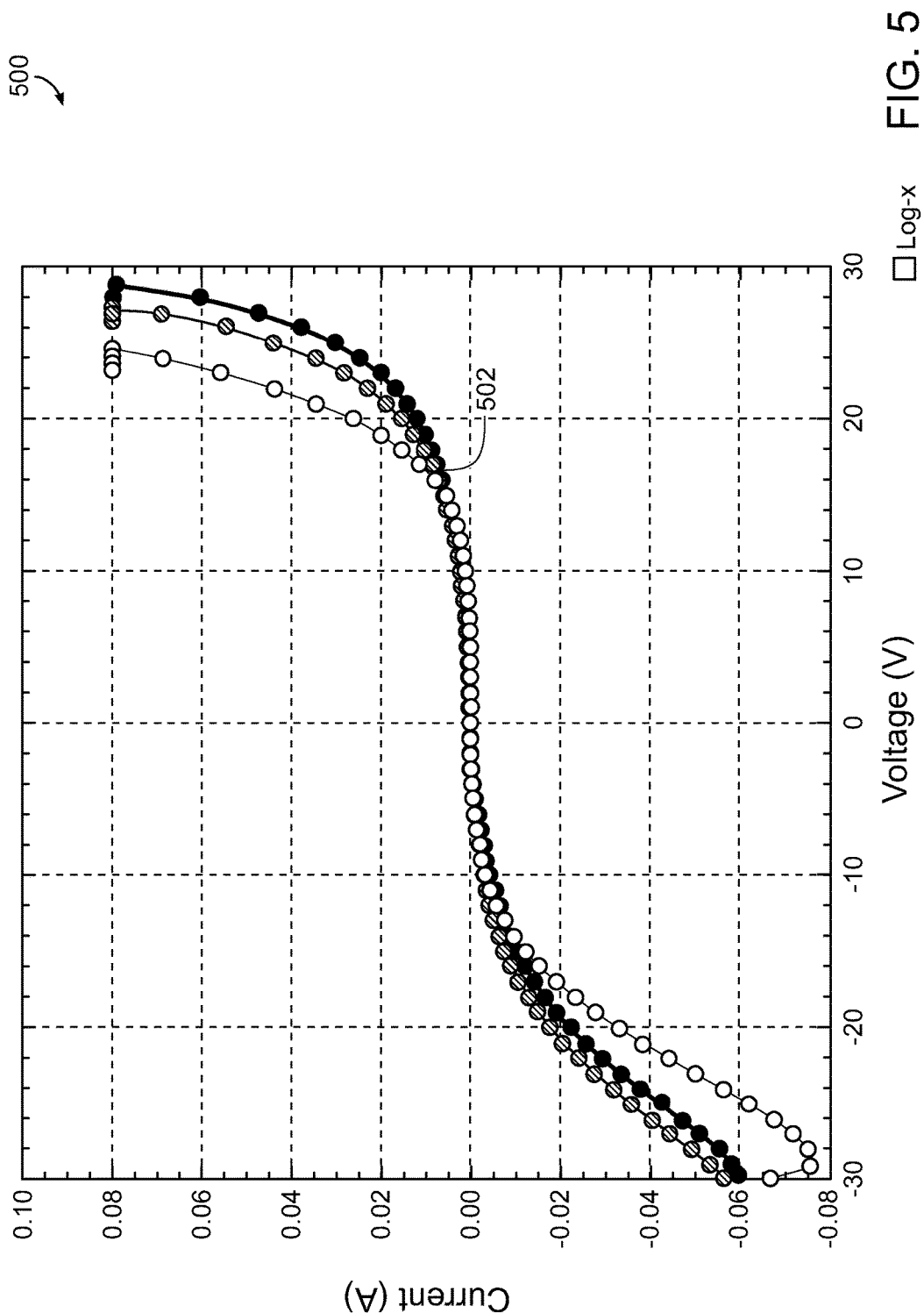
FIG. 5 is a graph showing an IV curve of a material for forming an ESD protection path.

Referring to FIG. 5, a graph 500 includes a current-voltage (IV) curve 502 illustrating the conductive properties of a material having a conductivity threshold voltage (e.g. material 302 or 304). The horizontal axis represents voltage across the material (in units of Volts) and the vertical axis represents current through the material (in units of Amperes). The measurements in FIG. 5 were taken using a sample of Loctite Ablestik QMI519 or Hysol QMI519. However, other materials or adhesives may also demonstrate a conductivity threshold voltage and may be suitable for forming ESD conduction path 202'. Curve 502 may be the same as or similar to curve 402, however the scales of the axes are different. In graph 500, the horizontal axis has a range of −30 V to 30 V and the vertical axis has a range of −0.08 A to 0.10 A.

As shown in FIG. 5, the material may allow current to flow bidirectionally, depending on the value of the voltage across the material. If the voltage across the material is between −10 V and 10 V, the current through the material is negligible, As the voltage rises above 10 V, current through the material begins to flow in the positive direction as shown by the rising shape of curve 502 between 10 V and 30 V. As the voltage decreases below −10V, current through the material begins to flow in the opposite, negative direction, as shown by the falling shape of curve 502 between −30 V and −10 V.

One skilled in the art will recognize that changing the thickness of the material may affect the resistance and may change the conductivity threshold voltage of the material. A thicker material, for example, may have higher resistance and/or a higher breakdown voltage while a thinner material may have lower resistance and/or a lower breakdown voltage, The thickness of the material and/or the type of material may be chosen to provide a specific breakdown voltage as desired.

Figure 6:
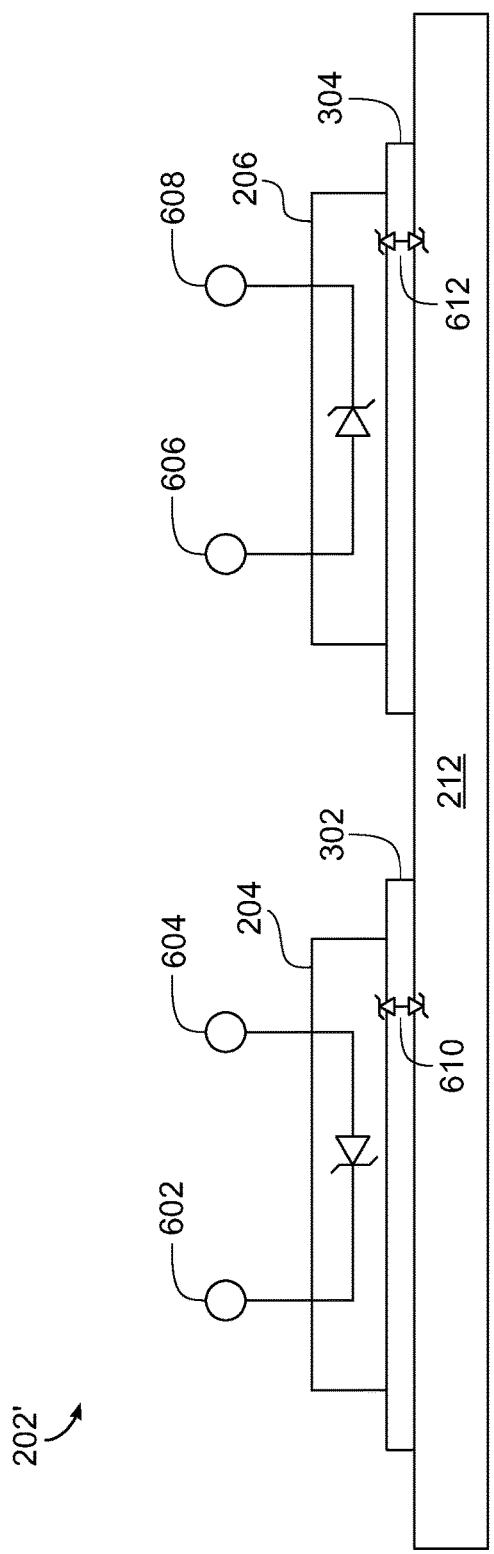
FIG. 6 is a cross-sectional view of an integrated circuit having multiple substrates and a material forming an electrostatic discharge (ESD) protection path.

Turning to FIG. 6, a cross-section of integrated circuit device 202' is shown viewed in the direction of arrow 306 in FIG. 3. The lead wires, substrate, and external leads are collectively illustrated by nodes 602-608 for clarity of illustration. As described above, integrated circuit device 200' may include material 302 interposed between substrate 204 and lead frame 212, and material 304 interposed between substrate 206 and lead frame 212. Material 302 and material 304 may be substantially flat layers of material between the substrates and the lead frame. In embodiments, material 302, material 304, or both may be an adhesive that holds substrates 204 and 206 in place on lead frame 212. Material 302 and 304 may have material properties that allow the material to act as a voltage-triggered conduction path, illustrated by Zener diode symbols 610 and 612 and as described above.

In the case of an ESD event between nodes 604 and 608, the ESD voltage across 604 and 608 may cause current to flow through integrated circuit device 202'. For example, assuming that the conductivity threshold voltage of material 302 and material 304 is about 45 V, an ESD event that causes the voltage across each material to exceed 45 V may cause material 302 and 304 to conduct current. In this situation, the charge from the ESD event may flow into an external lead (e.g. lead 214 in FIG. 3), through substrate 204, through material 302 (which is allowing current to flow as long as the voltage across material 302 exceeds its conductivity threshold voltage), through lead frame 212, through material 304 (which is allowing current to flow as long as the voltage across material 304 exceeds its conductivity threshold voltage), through substrate 206, and finally out to an external lead (e.g. external lead 220 of FIG. 3).

Figure 7:
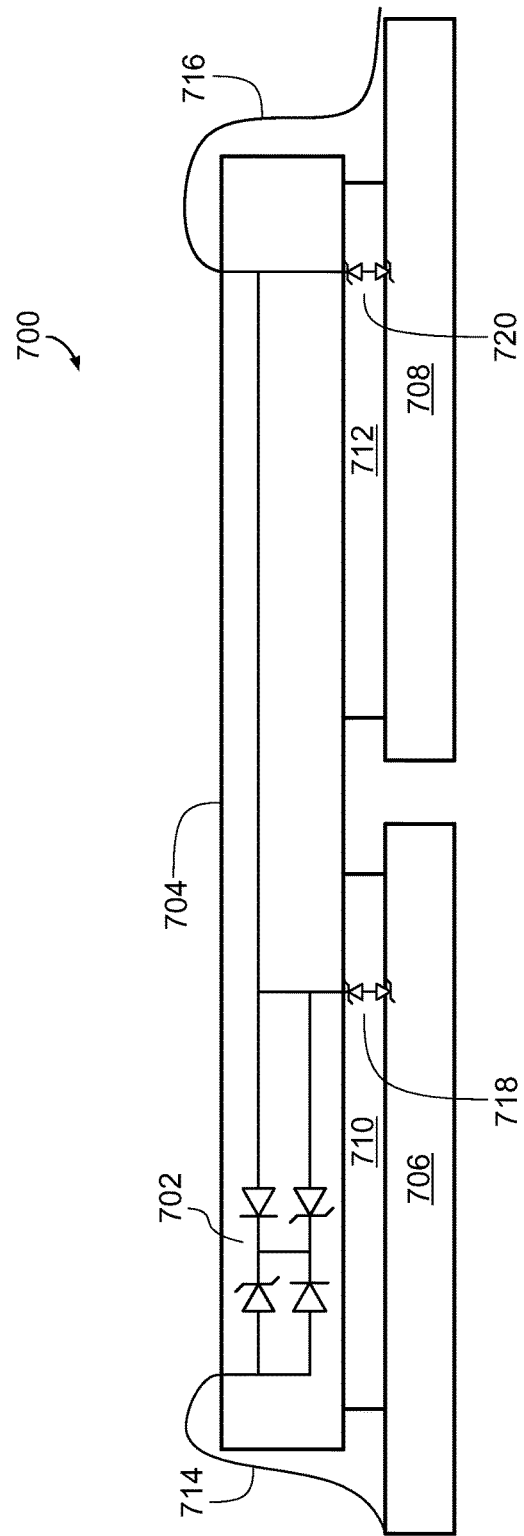
FIG. 7 is a cross-sectional view of an integrated circuit having a split lead frame and a material forming an electrostatic discharge protection path.

Referring now to FIG. 7, another embodiment of an integrated circuit device is shown in cross-sectional view.

Integrated circuit device 700 includes a single semiconductor substrate 704 that is supported by two die-attach portions of a lead frame, which will be referred to as paddles 706 and 708. The lead frame paddles 706 and 708 may be separate lead frame elements, which may be electrically isolated from each other, that both support the same silicon substrate 704. Further examples of split lead frame arrangements are described in U.S. Patent Application Publication No. 2013/0249546 A1 (corresponding to U.S. patent application Ser. No. 13/749,776 filed Jan. 25, 2013), which is incorporated here by reference in its entirety.

Integrated circuit device 700 also includes material 710 situated between substrate 704 and paddle 706, and material 712 situated between substrate 704 and paddle 708. Material 710 and material 712 may have material properties that allow the material to act as a voltage-triggered conduction path, illustrated by Zener diode symbols 718 and 720 and as described above. Lead wires 714 and 716 may be coupled to contact terminals (e.g. wire bond pads) on substrate 704, and also to lead frame contacts on paddles 706 and 708, respectively. An ESD protection circuit 702 included in substrate 704 may provide an ESD conduction path between lead wires 714 and 716.

Although not shown, either lead frame paddle 706, lead frame paddle 708, or both may support an additional semiconductor substrate and material 710 and 712 may provide additional ESD conduction paths through the additional substrate.

In the case of an ESD or other high-voltage event between, for example, paddles 706 and 708, material 710 and 712 may form a conduction path between the paddles. For example, in the case of an ESD or high voltage event that exceeds the conductivity threshold voltage of material 710 and 712, charge may flow from paddle 706, through material 710, through substrate 704, through material 712, and finally to paddle 708. In an embodiment, this conduction path may act as an alternate or parallel path to the conduction path provided by ESD protection circuit 702.

Although the circuits above are described as providing ESD conduction paths and ESD protection, one skilled in the art will recognize that the circuits, conduction paths, electronic device circuits, and other elements described above can also protect against other types of overvoltage conditions. For example, if another type of overvoltage condition is present, the conduction paths described above may allow charge/current associated with the overvoltage condition to flow through the conduction path, as described above, and avoid damage or malfunction of the integrated circuit device.

Having described preferred embodiments, which serve to illustrate various concepts, strictures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

The invention claimed is:

1. An apparatus comprising:
   a package;
   at least two leads exposed external to the package to permit electrical connections to the package;
   a first die situated in the package having a first substrate and at least a first terminal electrically coupled to a first one of the leads;
   a second die situated in the package having a second substrate and at least a second terminal electrically coupled to a second one of the leads; and
   a voltage-triggered conduction path between the first and second die to electrically isolate the second die from the first die under a first condition and provide an ESD current path between the first one of the leads and the second one of the leads under a second condition;
   wherein the voltage-triggered conduction path comprises a material having a conductivity threshold voltage.

2. The apparatus of claim 1 wherein the first and/or second die support a magnetic field sensor circuit.

3. The apparatus of claim 2 wherein the apparatus is a magnetic field sensor.

4. The apparatus of claim 1 wherein the first and/or second substrates comprise a ground plane.

5. The apparatus of claim 1 wherein the material is in physical contact with the first substrate and the second substrate.

6. The apparatus of claim 1 wherein the conductivity of the material is substantially zero when a voltage across the material is less than the conductivity threshold voltage.

7. The apparatus of claim 6 wherein the conductivity threshold voltage is about 45 volts.

8. The apparatus of claim 1 wherein a conductivity of the material increases as a voltage across the material increases.

9. The apparatus of claim 1 wherein the material is a substantially flat layer in contact with at least a portion of the first and second substrates.

10. The apparatus of claim 9 wherein the substantially flat layer is in contact with an entire surface of the first substrate and an entire surface of the second substrate.

11. The apparatus of claim 1 wherein the material is an adhesive.

12. The apparatus of claim 11 wherein the adhesive forms a layer that holds the first and/or second die in place within the package.

13. The apparatus of claim 12 wherein the package contains a lead frame comprising a die-attach portion and the adhesive holds the first and/or second die in contact with the die-attach portion.

14. The apparatus of claim 1 wherein the material forms a bi-directional ESD current path.

15. The apparatus of claim 1 wherein the first and second conditions are predetermined voltages across the ESD current path.

16. An apparatus comprising:
   a package;
   at least two leads extending from the package and providing electrical connections to the package;
   a first die situated in the package having a first substrate and at least a first terminal electrically coupled to a first one of the leads;
   a second die situated in the package having a second substrate and at least a second terminal electrically coupled to a second one of the leads, wherein the second die is electrically isolated from the first die; and
   an adhesive material forming a layer that supports the first and second die and holds the first and second die in place within the package, wherein the adhesive material forms an ESD current path between the first one of the leads and the second one of the leads.

17. The apparatus of claim 16 wherein the adhesive material forms a bi-directional ESD current path between the first one of the leads and the second one of the leads.

18. The apparatus of claim 16 wherein the adhesive material is in contact with at least a portion of a surface of the first die and at least a portion of a surface of the second die.

19. The apparatus of claim 18 wherein a conductivity of the adhesive increases as a voltage across the material increases.

20. An apparatus comprising:
a package;
a lead frame comprising:
a plurality of leads, at least two of which are exposed external to the package to permit electrical connections to the package;
at least two die-attach paddles, each associated with a respective lead;
a die situated in the package comprising:
a substrate;
a first terminal electrically coupled to a first one of the leads; and
a second terminal coupled to a second one of the leads; and
a voltage-triggered conduction path between the first and second die-attach paddles to electrically isolate the first die-attach paddle from the second die-attach paddle under a first condition and provide an ESD current path between the first die-attach paddle from the second die-attach paddle under a second condition.

21. The apparatus of claim 20 wherein the die supports a magnetic field sensor circuit.

22. The apparatus of claim 21 wherein the apparatus is a magnetic field sensor.

23. The apparatus of claim 20 wherein the voltage-triggered conduction path comprises a material having a conductivity threshold voltage.

24. The apparatus of claim 23 wherein the material is in physical contact with the substrate and at least one of the die-attach paddles.

25. The apparatus of claim 23 wherein the conductivity of the material is substantially zero when a voltage across the material is less than the conductivity threshold voltage.

26. The apparatus of claim 25 wherein the conductivity threshold voltage is about 45 volts.

27. The apparatus of claim 23 wherein a conductivity of the material increases as a voltage across the material increases.

28. The apparatus of claim 23 wherein the material is a substantially flat layer in contact with at least a portion of the substrate.

29. The apparatus of claim 23 wherein the material is an adhesive.

30. The apparatus of claim 29 wherein the adhesive forms a layer that adheres the die to the first and/or second die-attach paddles and holds the die in place within the package.

31. The apparatus of claim 23 wherein the material forms a bi-directional ESD current path.

32. The apparatus of claim 20 wherein the first and second conditions are predetermined voltages across the ESD current path.

* * * * *

UNITED STATES PATENT AND TRADEMARK OFFICE
CERTIFICATE OF CORRECTION

| | |
|---|---|
| PATENT NO. | : 10,147,688 B2 |
| APPLICATION NO. | : 15/053397 |
| DATED | : December 4, 2018 |
| INVENTOR(S) | : William Wilkinson et al. |

It is certified that error appears in the above-identified patent and that said Letters Patent is hereby corrected as shown below:

In the Specification

Column 2, Line 3, delete "within the package," and replace with --within the package.--

Column 7, Line 8, delete "to external lead 220," and replace with --to external lead 220.--

Signed and Sealed this
Fourteenth Day of May, 2019

Andrei Iancu
*Director of the United States Patent and Trademark Office*